(12) United States Patent
Yanagida et al.

(10) Patent No.: US 10,490,659 B2
(45) Date of Patent: Nov. 26, 2019

(54) SEMICONDUCTOR DEVICE AND PORTABLE APPARATUS USING THE SAME

(71) Applicant: UBIQ Semiconductor Corp., Zhubei, Hsinchu County (TW)

(72) Inventors: Masamichi Yanagida, Gunma-ken (JP); Masashi Koyano, Gunma-ken (JP); Nobuyoshi Matsuura, Gunma-ken (JP); Hiroki Arai, Gunma-ken (JP)

(73) Assignee: UPI SEMICONDUCTOR CORP., Zhubei, Hsinchu County (TW)

( * ) Notice: Subject to any disclaimer, the term of this patent is extended or adjusted under 35 U.S.C. 154(b) by 238 days.

(21) Appl. No.: 15/391,136

(22) Filed: Dec. 27, 2016

(65) Prior Publication Data
US 2017/0194294 A1 Jul. 6, 2017

(30) Foreign Application Priority Data
Jan. 6, 2016 (JP) ................................ 2016-001045

(51) Int. Cl.
*H01L 25/065* (2006.01)
*H05K 1/18* (2006.01)
(Continued)

(52) U.S. Cl.
CPC .... *H01L 29/7827* (2013.01); *H01L 23/49541* (2013.01); *H01L 23/49575* (2013.01); *H01L 27/0207* (2013.01); *H01L 27/088* (2013.01); *H01L 23/3121* (2013.01); *H01L 23/49503* (2013.01); *H01L 24/06* (2013.01); *H01L 24/16* (2013.01); *H01L 24/29* (2013.01); *H01L 24/32* (2013.01); *H01L 24/48* (2013.01); *H01L 24/73* (2013.01); *H01L 2224/0401* (2013.01);
(Continued)

(58) Field of Classification Search
None
See application file for complete search history.

(56) References Cited

U.S. PATENT DOCUMENTS

| | | | | |
|---|---|---|---|---|
| 2004/0070081 A1* | 4/2004 | Chien | ..................... | H01L 24/81 257/778 |
| 2005/0017339 A1* | 1/2005 | Yoshiba | ............ | H01L 23/49575 257/686 |
| 2011/0278709 A1* | 11/2011 | Lu | ........................... | H01L 24/37 257/676 |

OTHER PUBLICATIONS

TW Office Action dated Apr. 9, 2019 in corresponding Taiwan application (No. 10820325000).

* cited by examiner

*Primary Examiner* — Alexander G Ghyka
(74) *Attorney, Agent, or Firm* — McClure, Qualey & Rodack, LLP

(57) ABSTRACT

The present invention provides a semiconductor device that can achieve miniaturization or thinning of the size of the package while maintaining the characteristic of the MOSFET and reducing the on-resistance value, and a portable apparatus using the same. The gate electrodes 26 and 28 of the semiconductor chip 10 are disposed in the vicinity of the two side surfaces of the longitudinal direction (the x axis direction on the page) of the package 2, and the gate terminal 13 and 14 that is mounted with the gate electrodes 26 and 28 in a flip-chip manner are extended in the longitudinal direction of the package 2 and are derived to the outside from the two side surfaces 2A and 2B. Based on the configuration, it is capable of maximizing the size of the semiconductor chip with respect to the size of the package, and it is able to realize the high performance of the element characteristic for the module.

18 Claims, 10 Drawing Sheets

(51) Int. Cl.
  *H02J 7/00* (2006.01)
  *H01L 29/78* (2006.01)
  *H01L 23/495* (2006.01)
  *H01L 27/088* (2006.01)
  *H01L 27/02* (2006.01)
  *H01L 23/00* (2006.01)
  *H01L 23/31* (2006.01)

(52) U.S. Cl.
  CPC ............... *H01L 2224/04042* (2013.01); *H01L 2224/05553* (2013.01); *H01L 2224/05554* (2013.01); *H01L 2224/0603* (2013.01); *H01L 2224/06051* (2013.01); *H01L 2224/06181* (2013.01); *H01L 2224/16245* (2013.01); *H01L 2224/2919* (2013.01); *H01L 2224/32145* (2013.01); *H01L 2224/48091* (2013.01); *H01L 2224/48147* (2013.01); *H01L 2224/48247* (2013.01); *H01L 2224/48465* (2013.01); *H01L 2224/73253* (2013.01); *H01L 2224/73265* (2013.01); *H01L 2224/85439* (2013.01); *H01L 2924/00014* (2013.01); *H01L 2924/13091* (2013.01); *H01L 2924/14* (2013.01); *H01L 2924/181* (2013.01); *H01L 2924/3512* (2013.01); *H02J 7/0029* (2013.01)

SEMICONDUCTOR DEVICE AND PORTABLE APPARATUS USING THE SAME

FIELD OF INVENTION

The present invention is related to a semiconductor device having a package with a plurality of chips embedded that is able to decrease the on-resistance value by mounting in a flip-chip manner and is able to achieve miniaturization or thinning of the size of the package, and a portable apparatus using the same.

BACKGROUND

The configuration shown in FIG. 6 is known as the semiconductor device used for the conventional charge protection device. As shown in the drawing, the resin package 101 is embedded with FET 102 (hereinafter, represented as charge FET 102) as a switch for charging control, FET 103 (hereinafter, represented as discharge FET 103) as a switch for discharging control, and a protection IC 104. The line indicated by the dotted line 105 is the peripheral line of the resin package 101, the configuration of one package is implemented thereby.

The drain electrode of the charge FET 102 is fixed on the die pad inner lead 107 of the lead frame 106 through the silver paste. Then the source electrode 108 and the gate electrode 109 of the charge FET 102 are electrically connected to the inner lead 107 of the lead frame 106 through the wire 110.

The discharge FET 103 and the protection IC 104 are also the same as the charge FET 102; they are fixed on the lead frame 106 and electrically connected to the inner lead 107 through the wire 110 (For example, referred to the patent reference 1).

Also, the configuration shown in FIG. 7 is known as the semiconductor device embedded with a plurality of the conventional power MOSFET. As shown in the drawing, two MOSFETs 121 and 122 are fixed on the upper surface of the mounting section 123 of the lead frame, and the mounting section 123 is derived to the outside as four drain terminals 125 from the side of the side surface of the package 124. In addition, the gate terminals 126 and 127 and the source terminals 128 and 129 separated from the mounting section 123 are formed at the lead frame, and are respectively derived to the outside from the side surface opposite to the side surface of the package 124 derived as the drain terminal 125.

The source electrode 130 of MOSFET 121 and the source terminal 128 are electrically connected with three bonding wire, the source electrode 132 of MOSFET 122 and the source terminal 129 are electrically connected with three bonding wires 133. As shown in the drawings, it is able to achieve large current through a plurality of the bonding wires 131 and 133 respectively for the source electrodes 130 and 132 (For example, referred to the patent reference 2).

Furthermore, the configuration shown in FIG. 8 is known as the semiconductor device embedded with the conventional MOSFET. As shown in the drawing, the main surface of the silicon chip 141 formed with the power MOSFET is formed with the source pad (source electrode) 142 and the gate pad (gate electrode) 143, and the drain pad (not shown in the drawing) is formed at the back surface. Next, the silicon chip 141 is bonded to the upper surface of the die pad part 144 through the Ag paste, four leads 145 for the drains connected with the die pad part 144 are derived to the outside from the side of one side surface of the resin package 146.

The source pad 142 of the silicon chip 141 and the lead 148 for source are electrically connected by the Al ribbon 147, thereby reduce the on-resistance value. Then three leads 148 for source is derived to the outside from the side of the side surface of the resin package 146 at opposite side of the side surface that the lead 145 is derived. The gate pad 143 of the silicon chip 141 and the lead frame are electrically connected through the Al wire 149, such that the lead 150 for gate is derived to the outside from the side of one side surface of the resin package 146 (For example, referred to the patent reference 3).

PATENT DOCUMENTS

Patent reference 1: Japanese Patent Application Publication No. 2010-11736
Patent reference 2: Japanese Patent Application Publication No. 2009-38138
Patent reference 3: Japanese Patent Application Publication No. 2013-16837

SUMMARY OF THE INVENTION

Problem to be Solved

Recently, along with the miniaturization and thinning of the portable apparatus such as the portable phone and the smart phone etc., the miniaturization and thinning of the electronic component used therein are also required. For this purpose, it is necessary to achieve the reduction of the on-resistance value and the miniaturization and the thinning of the size of the package while increasing the current of the electronic component.

The semiconductor device shown in FIG. 6 is used as the protection device of the secondary battery of the lithium ion batteries etc. The charge FET 102, discharge FET 103 and the protection IC 104 are arranged side by side on the upper surface of the lead frame 106 to constitute one package, without using the stack configuration of chips, it would be a difficult problem to miniaturize any more resin packages.

Furthermore, for the semiconductor device shown in FIG. 6, because of the configuration that the wire 110 is connected to the source electrode 108 of the charge FET 102 and the source electrode 111 of the discharge FET 103 with large current flowing, it would be a difficult problem to reduce the on-resistance value.

Here, for the semiconductor device shown in FIG. 7 and FIG. 8, IC chip is not embedded therein, but as shown in FIG. 7, a configuration using a plurality of the thick bonding wires 131 and 133 for the large current is known. On the other hand, it would be difficult to reduce the on-resistance value by the configuration using a plurality of the thick bonding wires 131 and 133, as shown in FIG. 8; it is also known that using Al ribbon 147 with respect to the large current, the configuration can reduce the on-resistance value and the connection-resistance value.

From the above, in the semiconductor device shown in FIG. 6, it is taken into consideration to reduce the on-resistance value with respect to the large current by using the Al ribbon, however, with respect to the Al ribbon for large current, it generally implement a configuration that almost entire source electrodes 108 and 111 are fixed. Based on the configuration, it would be difficult to stack the protection IC 104 on the charge FET 102 and the discharge FET 103 in view of the perspective of the space, there is also a problem in that it is difficult to miniaturize the resin package by the configuration using the Al ribbon.

Furthermore, along with the thinning of the above portable apparatus, the size of a circuit board accommodated in the package of the portable apparatus is limited by the thickness of the portable apparatus, for example, the protection circuit board realizing the battery management of the charge and discharge of the secondary battery of the lithium ion battery etc. For this reason, the size of the electrical components mounted on the protection circuit board are also limited, in order to maximize the element characteristics with the limitation of the size and reduce the on-resistance value, it is also required a design based on the layout of the electrodes of the semiconductor chip and the layout of the frame.

The present invention has been made in view of the above circumstances, for the configuration that a plurality of the chips are embedded in one package, the mounting in a flip-chip manner is used, and a semiconductor device that can reduce the on-resistance while realize the miniaturization and thinning of the size of the package and a portable apparatus using the same are provided.

Means for Solving the Problem

According to one embodiment, a semiconductor device is disclosed. The semiconductor device comprises: a frame; a semiconductor chip having a main surface mounted on the frame in a flip-chip manner; an integrated circuit (IC) chip stacked and fixed on a surface of the semiconductor chip opposite to the main surface; a metal wire electrically connected to the semiconductor chip and the IC chip; and a package encapsulating the frame, the semiconductor chip, the IC chip, and the metal wire. The package has two side surfaces opposite to each other in the longitudinal direction of the package. The semiconductor chip is formed with a first transistor and a second transistor. A gate electrode of the first transistor formed on the main surface is arranged beside one of the side surfaces of the package.

Furthermore, in the semiconductor device of the present invention, a portion of the frame where the gate electrode of the first transistor is mounted extends along the longitudinal direction and is exposed from the one of the side surfaces of the package, and another portion of the frame where the gate electrode of the second transistor is mounted extends along the longitudinal direction and is exposed from the other one of the side surfaces of the package.

Furthermore, in the semiconductor device of the present invention, the metal wire electrically connected to the gate electrode of the first transistor is connected to the frame between the gate electrode of the first transistor and the one of the side surfaces of the package, and the metal wire electrically connected with the gate electrode of the second transistor is connected to the frame between the gate electrode of the second transistor and the other one of the side surfaces of the package.

Furthermore, in the semiconductor device of the present invention, the semiconductor chip has a source electrode of the first transistor formed on the main surface, a source electrode of the second transistor formed on the main surface, and a common drain electrode of the first transistor and the second transistor formed on the surface opposite to the main surface. The frame where the source electrode of the first transistor is mounted is exposed from the one of the side surfaces of the package, and the frame where the source electrode of the second transistor is mounted is exposed from the other one of the side surfaces of the package.

Furthermore, the semiconductor device of the present invention comprises a source electrode of the first transistor arranged side by side with the gate electrode of the first transistor in the longitudinal direction of the semiconductor chip; a source electrode of the second transistor arranged side by side with the gate electrode of the second transistor in the longitudinal direction of the semiconductor chip. The gate electrode and the source electrode of the first transistor and the gate electrode and the source electrode of the second transistor are disposed rotationally symmetric with respect to a central point of the semiconductor chip.

Furthermore, according to one embodiment, a portable apparatus is disclosed. The portable apparatus of the present invention comprises a protection circuit board for a secondary battery; and the semiconductor device stated above. The package of the semiconductor device is mounted on the protection circuit board for a secondary battery of the portable apparatus. The longitudinal direction of the package is disposed along the longitudinal direction of the protection circuit board, and the transverse direction of the protection circuit board is disposed along the thickness direction of a housing of the portable apparatus.

Effect of the Invention

Through the semiconductor device of the present invention, the semiconductor chip is mounted on the frame in a flip-chip manner, and the IC chip controlling the semiconductor chip is stacked on the upper surface of the semiconductor chip. The semiconductor chip and the IC chip are electrically connected through the metal wire. Next, the two gate electrodes of the semiconductor chip are disposed beside the side surfaces opposite to each other in the longitudinal direction of the package, the gate electrode and the frame mounted in a flip-chip manner are exposed from the two side surfaces of the package. Based on the configuration, it is able to maximize the size of the semiconductor chip with respect to the size of the package, and it is able to achieve high performance of the element characteristic for the module.

Further, through the semiconductor device of the present invention, the two gate electrode of the semiconductor chips are disposed beside the two side surface of the package, and the gate electrode and the frame mounted in a flip-chip manner are extended to the longitudinal direction of the package. Also, the metal wires are connected on the frame extended in the longitudinal direction, thereby it is able to maximize the size of the semiconductor chip with respect to the transverse direction of the package.

Also, in the semiconductor device of the present invention, it is able to maximize the size of the semiconductor chip with respect to the size of the package.

Also, in the semiconductor device of the present invention, two MOSFETs are formed on the semiconductor chip, each source and gate electrodes are respectively disposed rotationally symmetric with respect to a central point of the semiconductor chip. Based on the configuration, the semiconductor chip is able to work even in the state mounted by 180° rotation from the correct position with respect to the frame, the yield according to the mount error is therefore improved.

Further, in the portable apparatus of the present invention, the minimized package is mounted with respect to the protection circuit board of the secondary battery accommodated in the thinning housing. Based on the configuration, it is able to realize a portable apparatus that can suppresses the power consuming and can be used for a long span.

DESCRIPTION OF THE DRAWINGS

FIGS. 5(A)-5(B) illustrates the views illustrating the portable apparatus using the semiconductor device of an embodiment of the present invention, in which FIG. 5(A) is the perspective view illustrating a housing of a portable apparatus, FIG. 5(B) is the circuit diagram.

DETAILED DESCRIPTION

Figure 1:
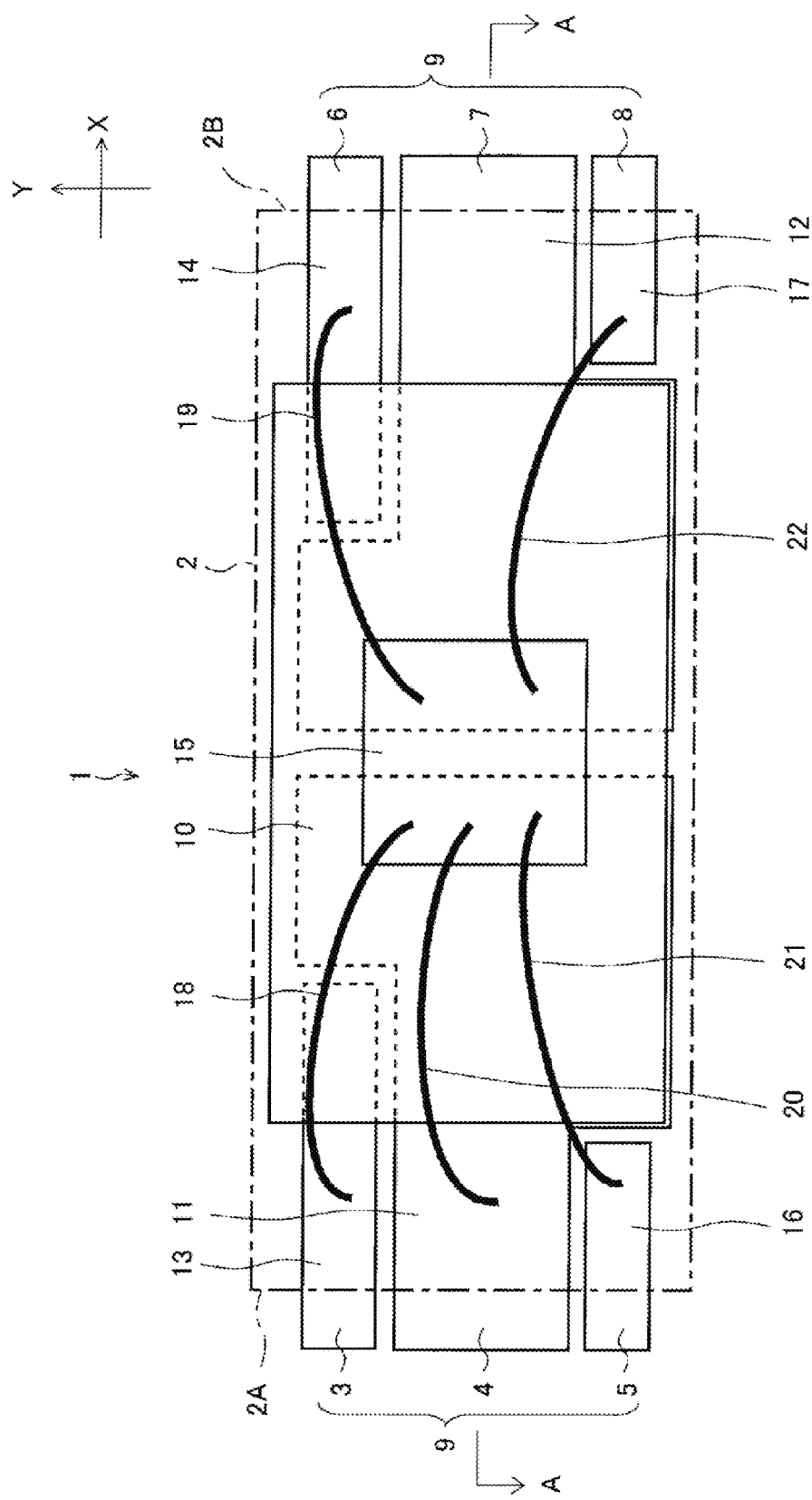
FIG. 1 illustrates a plan view of the inner configuration of the semiconductor chip of a preferred embodiment in an embodiment of the present invention.

Hereinafter, a semiconductor device of an embodiment of the present invention will be illustrated in detail in accordance with the drawings. Moreover, in the description of one embodiment, the same reference numerals are generally used for the same members, and repeated explanation thereof is omitted.

Figure 2A:
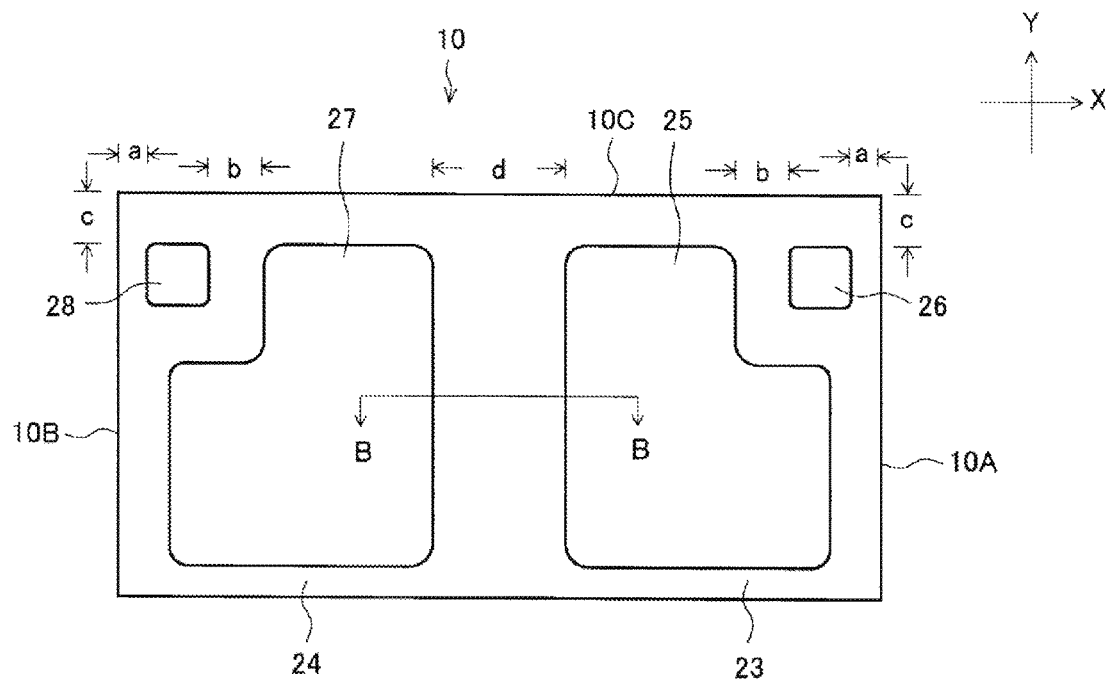
FIG. 2(A) illustrates a plan view and FIG. 2(B) illustrates a cross-sectional view illustrating the semiconductor chip embedded in the semiconductor device in an embodiment of the present invention.
Figure 2B:
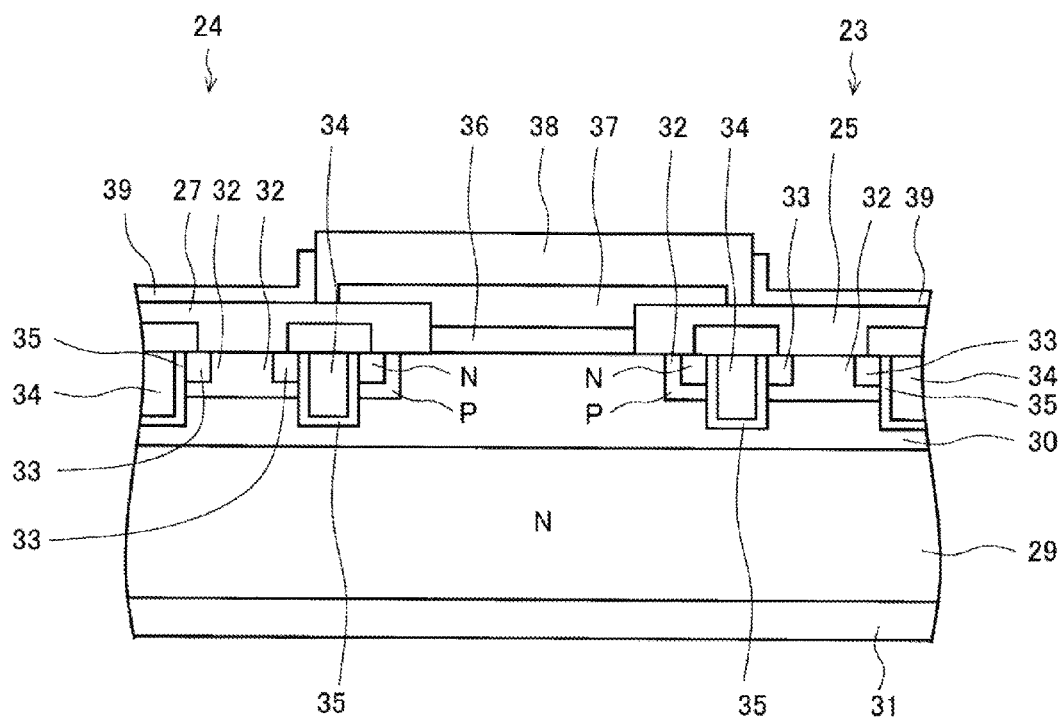
Figure 3A:
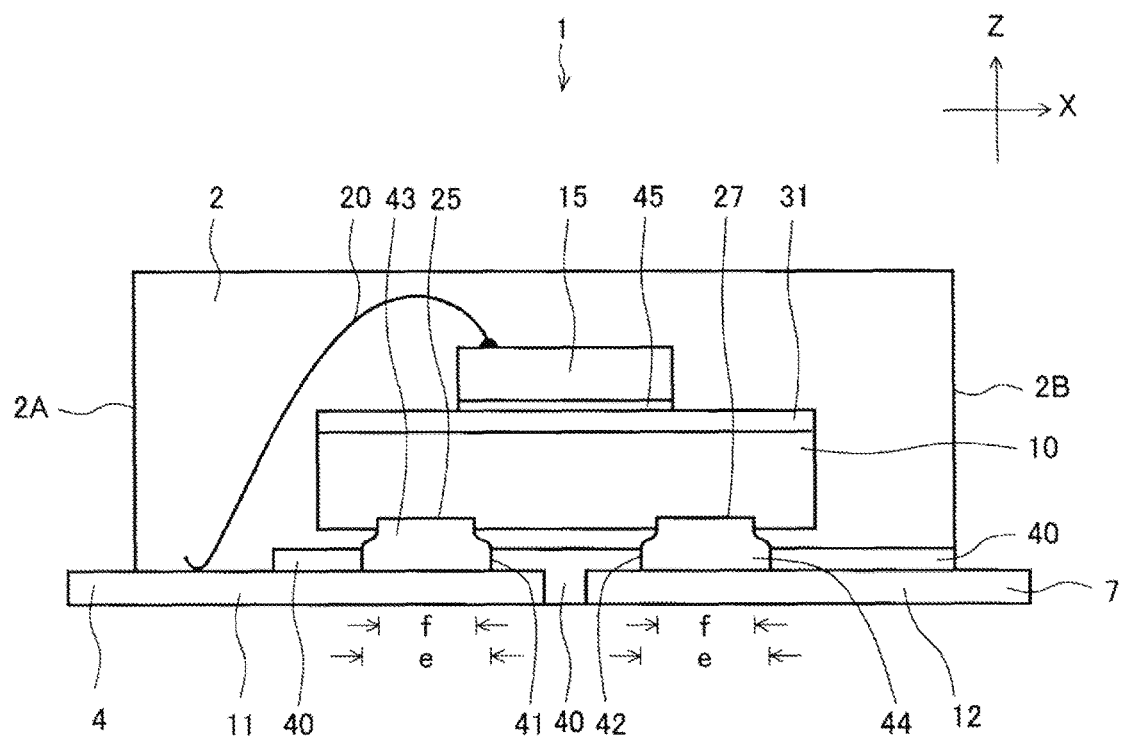
FIG. 3(A) illustrates a cross-sectional view and FIG. 3(B) illustrates a cross-sectional view illustrating the inner configuration in the semiconductor device of an embodiment of the present invention.
Figure 3B:
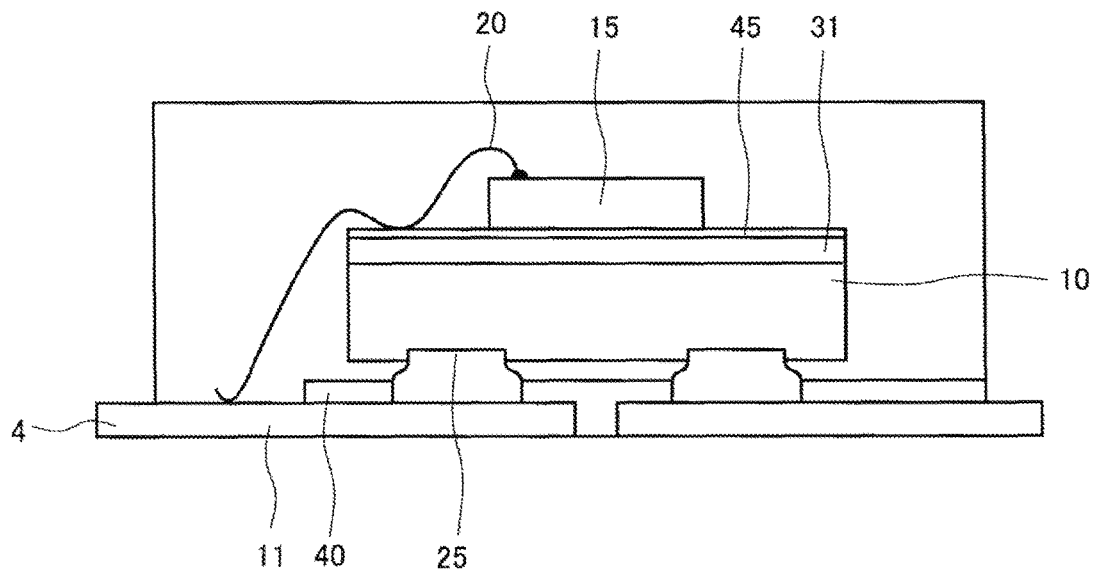

FIG. 1 illustrates a plan view of the inner configuration of the package of the semiconductor device. FIG. 2(A) illustrates a plan view illustrating the semiconductor chip embedded in the semiconductor device, and FIG. 2(B) illustrates a partial cross-sectional view of the profile B-B of the semiconductor chip shown in FIG. 2(A). FIG. 3(A) illustrates a cross-sectional view illustrating the cross-sectional view of the profile A-A of the semiconductor device shown in FIG. 1, and FIG. 3(B) illustrates a cross-sectional view illustrating a modified example of the cross-sectional view of the profile A-A of the semiconductor device shown in FIG. 1, As shown in FIG. 1, the semiconductor device 1 of an embodiment of the present invention is a configuration that the leads 3, 4, 5, 6, 7, 8 of six pins are derived to the outside from the two side surfaces 2A and 2B of the package 2 indicated by the long dashed short dashed line. Next, for example, the size of the package 2 along the width of x-axis direction on the page (the longitudinal direction of the package) is 5 mm, and the size of the package 2 along the width of y-axis direction on the page (the transverse direction of the package) is 2 mm. Also, in one aspect of the present embodiment, although the semiconductor device 1 is depicted as a six pin configuration, the configuration is not limited thereto, eight pins configuration or any appropriate design changes are possible. Moreover, any appropriate design changes to the size of the package are also possible.

Frame 9 is made of metals such as Cu and Fe—Ni alloy etc., the surface thereof is plated with the Ni—Pd—Au etc. Frame 9 is provided with the source electrodes 25 and 27 of the semiconductor chip 10 (referred to FIG. 2(A)) and the source terminals 11 and 12 mounted in a flip-chip manner, the gate electrodes 26 and 28 of the semiconductor chip 10 (referred to FIG. 2(A)) and the gate terminals 13 and 14 mounted in a flip-chip manner, and the VDD terminal 16 and the VM terminal 17 as the power terminals connected through the electrode pads (not shown in the drawings) of the IC chip 15 and the metal wires 21 and 22.

The source terminals 11 and 12 are divided along the y-axis direction on the page at the central area of the package 2, and each are extended to the x-axis direction on the page respectively. The source terminals 11 and 12 are mounted with the source electrodes 25 and 27 of the semiconductor chips 10 (referred to FIG. 2(A)) in a flip-chip manner, the most of the semiconductor chip 10 is fixed so as to play a role as a die pad.

Next, the parts derived from the two side surfaces 2A and 2B of the package 2 of the source terminals 11 and 12 to the outside are used as the leads 4 and 7 for the source electrodes. As shown in the drawings, the width of the leads 4 and 7 are formed widely, the on-resistance value for the wiring part is decreased, and it is able to cope with a large current.

The gate terminals 13 and 14 are extended from the top left (on the page) and the top right (on the page) of the package 2 to the x-axis direction (on the page), respectively. The gate terminals 13 and 14 are mounted with the gate electrodes 26 and 28 of the semiconductor chip 10 (referred to FIG. 2(A)) in a flip-chip manner. Next, the parts derived from the two side surfaces 2A and 2B of the package 2 of the gate terminals 13 and 14 to the outside are used as the leads 3 and 6 for the gate electrodes.

As shown in the drawings, the gate terminals 13 and 14 are extended to the x-axis direction on the page in a linear shape, and are derived from the two side surfaces 2A and 2B of the package 2. Next, the metal wires 18 and 19 are extend from the electrode pad of the IC chip 15 to the x-axis direction on the page, and electrically connected to the gate terminals 13 and 14 between the end portion of the semiconductor chip 10 and the side faces 2A and 2B.

Based on the configuration, regarding to the gate terminals 13 and 14 and the leads 3 and 6 for gate electrodes, there is no necessity to consider the space for extension to the outside of the y-axis direction on the page than the end portion of the semiconductor chip 10. Next, in the y-axis direction on the page, the width of the semiconductor chip 10 is able to widen at maximum with respect to the width of the package 2, the deterioration of element characteristics of the semiconductor chip 10 due to reduction in chip size is prevented. In other words, it is possible to improve the performance of the element characteristics of the semiconductor chip 10 at maximum with respect to the size of the package 2.

Further, since the leads 3 to 8 are structured to be derived from the two side faces 2A and 2B of the package 2, the metal wires 20, 21 and 22 are also approximately extended from the electrode pad of the IC chip 15 to the x-axis direction on the page. As shown in the drawings, the metal wires 18 to 22 electrically connecting the IC chip 15 and the semiconductor chip 10 are disposed approximately as an X shape of Western letters. Moreover, the metal wires 18 to 22 are not crossed with each other, thereby realize the thinning of the package 2.

As shown in FIG. 2(A), two MOSFETs, for example, N channel type MOSFETs 23 and 24 are formed at the semiconductor chip 10, and the source electrodes 25 and 27 and the gate electrodes 26 and 28 are respectively formed at the main surface thereof. For example, MOSFETs 23 and 24 are differentially disposed in the left and right directions on the page, wherein the gate electrode 26 of MOSFET 23 is disposed in the vicinity of the upper end portion of the right side on the page of the semiconductor chip 10, and the gate electrode 28 of MOSFET 24 is disposed in the vicinity of the upper end portion of the left side on the page of the semiconductor chip 10.

As used in FIG. 1, the semiconductor chip 10 is mounted with respect to the frame 9 (referred to FIG. 1) in a flip-chip manner, since the gate electrodes 26 and 28 are disposed in the vicinity of the two end portion of the x-axis direction on the page of the semiconductor chip 10, it is able to realize the configuration that the leads 3 and 6 for the gate electrodes (referred to FIG. 1) are derived from the two side surfaces 2A and 2B (referred to FIG. 1) of the package 2 (referred to FIG. 1) to the outside.

Based on the above lead configuration, in the y-axis direction on the page, the width of the semiconductor chip 10 is widely formed, the width of the source electrodes 25 and 27 are also widely formed, therefore a large number of cells can be formed in the semiconductor chip 10. Next, the size of the protection circuit board for the secondary battery is limited in order to be disposed in the narrow space of the portable apparatus such as the smart phone etc., while the size of the MOSFET 23 and 24 with respect to the protection circuit board are enlarged as possible as it can, therefore it is possible to improve the performance of the characteristic for the module.

Moreover, in each MOSFET 23 and 24, the separation distance a from the gate electrodes 26 and 28 to the side surfaces 10A and 10B of the semiconductor chip 10 is shorter than the separation distance b from the gate electrodes 26 and 28 to the source electrodes 25 and 27.

Based on the configuration, when the semiconductor chip 10 is mounted at the frame 9 in a flip-chip manner, a configuration that it is hard for the gate electrodes 26 and 28 and the source electrodes 25 and 27 to be short-circuited due to the soldering can be realized.

Furthermore, the gate electrodes 26 and 28 are disposed to be near the side surfaces 10A and 10B of the semiconductor chip 10 as possible as it can, the source electrodes 25 and 27 are widely disposed, the on-resistance value for the wiring is decreased, and it is possible to cope with a large current.

Similarity, the separation distance c from the gate electrodes 26 and 28 to the side surfaces 10C of the semiconductor chip 10 is shorter than the separation distance d between the source electrodes 25 and 27. Based on the configuration, in the x-axis direction on the page, a configuration that it is hard for the source electrodes 25 and 27 to be short-circuited due to the soldering can be realized. On the other hands, in the y-axis direction on the page, the source electrodes 25 and 27 are widely disposed, the on-resistance value for the wiring is decreased, and it is possible to cope with a large current.

Further, as shown in the drawings, the source electrodes 25 and 27 and the gate electrodes 26 and 28 are formed with the corner portion thereof as the curved surface shape. As described above, the semiconductor chip 10 is mounted at the frame 9 in a flip-chip manner, a configuration that it is hard for the stress at the corner portion of the above electrodes 25-28 due to the soldering to be concentrated is formed, and the configuration that it is hard to cause the mounting failure such as the crack into the soldering can be realized.

As shown in FIG. 2(B), for example, the semiconductor chip 10 is stacked with the N type epitaxial layer 30 at the N type semiconductor substrate 29, and is formed with the two MOSFET 23 and 24 at the semiconductor substrate 29 and the N type epitaxial layer 30. MOSFET 23 and 24 are formed to be separated from the central area of the semiconductor chip 10 a certain distance so as to be electrically separated, the common drain electrode 31 is formed at the back side of the semiconductor substrate 29.

The drain electrode 31 is formed as a stack configuration of metal layers mainly constituted of Al and Al alloy, for example, it has a thickness of about 10 to 20 µm, by increasing the film thickness, the on-resistance value in the wiring is reduced, and it is possible to cope with a large current. Moreover, the drain electrode 31 is used in common, the current path can be shortened, and the operation area can also be increased based on the high integration.

A plurality of P type back gate areas 32 are formed in the epitaxial layer 30, the N type source areas 33, the gate electrode 34 mediated by a trench, and the gate oxide film 35 are formed with respect to the back gate areas 32. A plurality of cell areas of the above configuration are formed at the epitaxial layer 30. Next, as an insulating layer, for example, the TEOS film 36, SiN film 37 and PI film 38 are formed on the upper surface of the epitaxial layer 30.

Moreover, the source electrodes 25 and 27 and the gate electrodes 26 and 28 (not shown in the drawings) made from the metal layer such as Al and Al alloy etc. are formed on the upper surface of the epitaxial layer 30. As shown in FIG. 2(A), the above insulating layer is partially opened, and the source electrode 25 and 27 and the gate electrodes 26 and 28 (not shown in the drawings) are exposed from the side of the main surface of the semiconductor chip 10. Next, the UBM layer 39 covering the exposed source electrode 25 and 27 and the exposed gate electrodes 26 and 28 (not shown in the drawings) is formed. The UBM layer 39 is, for example, a Ni—Pd—Au layer.

As shown in FIG. 3(A), the insulating layer 40 is coated so as to cover the frame 9, the open portions 41 and 42 are formed at the insulating layer 40 by etching. The open portions 41 and 42 are disposed to correspond to the source electrodes 25 and 27 of the semiconductor chip 10, the shape of the open portions 41 and 42 are similar to the shape of the source electrodes 25 and 27. Specifically, as shown in FIG. 2(A), the shape of the source electrodes 25 and 27 are substantially an L shape of a European character, and the shape of the open portions 41 and 42 are also substantially an L shape of a European character.

As shown in the drawing, the width e of the opening of the open portions 41 and 42 is formed to be a slightly wider shape than the width f of the source electrodes 25 and 27. Next, solder paste is screen-printed on the upper surfaces of the source terminals 11 and 12 of the open portions 41 and 42, the semiconductor chip 10 is mounted in a flip-chip manner and the reflow process is performed. Yet it might be also applicable to use a silver paste instead of the solder paste.

Since the width e of the above opening is wider than the width f of the electrode, the cured shapes of the solder 43 and 44 are widened on the side of the frame 9, and the semiconductor chip 10 is fixed on the frame 9 in a stable state. Next, by hardening the solders 43 and 44 into a stable shape, cracks due to stress concentration are prevented from occurring in the solders 43 and 44, and occurrence of poor connection is prevented.

Then, although it is not shown in the drawings, the open portions corresponding to the gate electrodes 26 and 28 are also formed at the insulating layer 40, and the opening shape thereof is also similar to the shape of the gate electrodes 26 and 28, some are formed to be a lager shape than the gate electrodes 26 and 28.

The IC chip 15 is fixed on the upper surface of the drain electrode 31 of the semiconductor chip 10 through the insulating adhesive film 45. The IC chip 15 and the semiconductor chip 10 are electrically insulated by the insulating adhesive film 45. Next, electrode pad (not shown in the drawing) of the IC chip 15 and the source terminal 11 are electrically connected by the metal wire 20. Although the drain electrode 31 of the semiconductor chip 10 is in an exposed state, the metal wire 20 is formed so as not to be in contact with the drain electrode 31.

The package 2 encapsulates the frame 9, the semiconductor chip 10, the IC chip 15 and the metal wire etc., through the encapsulating resin etc., such as the epoxy series. As shown in the drawings, the source terminals 11 and 12 are exposed from the side of the back side of package 2, and the leads 4 and 7 for the source electrodes are derived from the side surfaces 2A and 2B of the packages 2 to the outside.

As described above, in the semiconductor chip 10, the source electrodes 25 and 27 through which the main current flows are mounted to the frame 9 in a flip-chip manner, similarly, the film thickness of the metal layer is increased in the drain electrodes 31 through which the main current flows, therefore to reduce the on-resistance respectively. Also, the IC chip 15 is the control IC of the semiconductor chip 10, and a small current flows between the semiconductor chip 10 and the IC chip 15. Therefore, in particular, the metal wires 18-22 which possess reduced necessity to consider the on-resistance value are used.

Based on the configuration, in the semiconductor device 1, it is possible to reduce the on-resistance without using a metal ribbon, realizing a large current and reducing power consumption by reducing the amount of heat generation. Furthermore, by adopting a configuration without using a metal ribbon, miniaturization of the size of the package can be realized.

In FIG. 3(B), a modified example of the configuration shown in FIG. 3(A) is shown. As shown in the drawings, the insulating adhesive film 45 cover the whole surface of the drain electrodes 31 of the semiconductor chip 10, the IC chip is fixed on the upper surface of the insulating adhesive film 45. Next the electrode pad (not shown in the drawings) of the IC chip and the source terminal 11 are electrically connected through the metal wire 20.

Meanwhile, after the metal wire 20 is ball-bonded on the electrode pad of the IC chip 15, it is once bended on the upper surface of the insulating adhesive film 45 and is stitch-bonded on the upper surface of the source terminal 11. Based on the configuration, it is able to decrease the wire loop height of the metal wire 20, and the thinning of the package 2 can be realized. Next, whether the metal wire 20 is in contact with the insulating adhesive film 45 or not, upon the metal wire 20 is located in the vicinity of the insulating adhesive film 45, the source electrodes 25 and the drain electrode 31 would not be short-circuited.

In particular, as the package 2 mounted on the protection circuit board of the secondary battery, in the package 2 with the width in the x-axis direction on the page widely formed, the metal wire 20 is prevented from contacting the terminal portion of the drain electrode 31, as shown in FIG. 3(A), the loop top of the metal wire 20 tends to be higher. Next, since the shape of the metal wire 20 becomes the shape shown in FIG. 3(B), it is able to lower the loop top of the metal wire 20, such that the thinning of the package 2 can be easily realized. Also, in accordance with the length of the package 2, the metal wire 20 in a loop shape contacted multiple times on the upper surface of the insulating adhesive film 45 might also be applicable.

Moreover, the configuration of the other constituent component shown in FIG. 3(B) is the same as the configuration depicted in FIG. 3(A), and thus the description thereof will be omitted here.

Further, although a case that the open portions 41 and 42 are provided in the insulating layer 40 has been described, the present invention is not limited to this case. For example, a groove having the same shape as the shapes of the open portions 41 and 42 may be formed in the frame 9 without using the insulating layer 40, and any configuration would be applicable as long as it can prevent the flow of the solder from occurring.

Otherwise, although a case that the width e of the opening of the open portions 41 and 42 are wider than the width f of the source electrode 25 and 27 is illustrated, the present invention is not limited to this case. For example, in a case that width e of the opening is the same size as the width f, the hardened shape of the solders 43 and 44 is barrel-shaped, and it is also possible for this case to realize a configuration that the stress due to the soldering is hard to be concentrated.

Figure 4A:
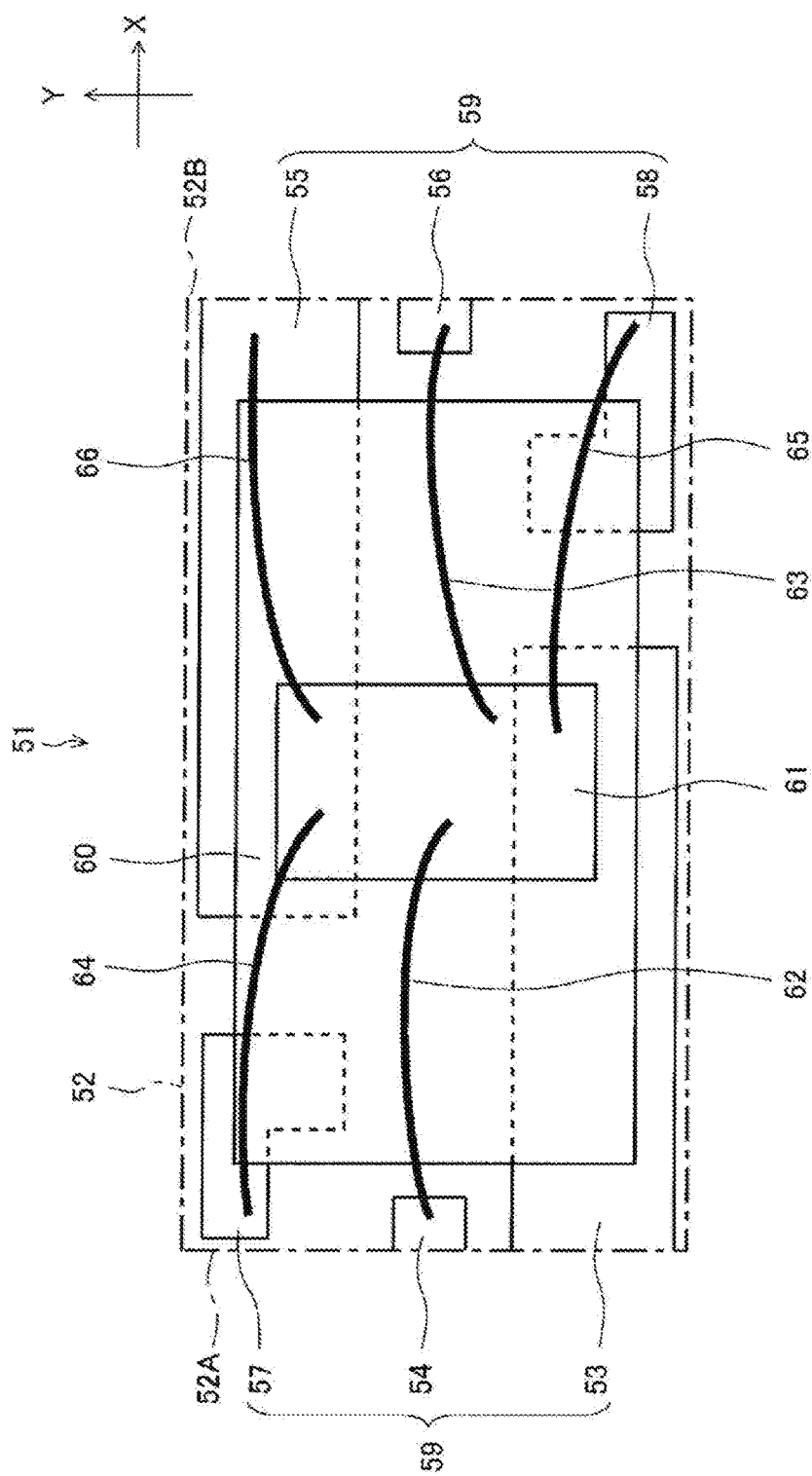
FIG. 4(A) illustrates a plan view illustrating the inner configuration of the semiconductor device.
Figure 4B:
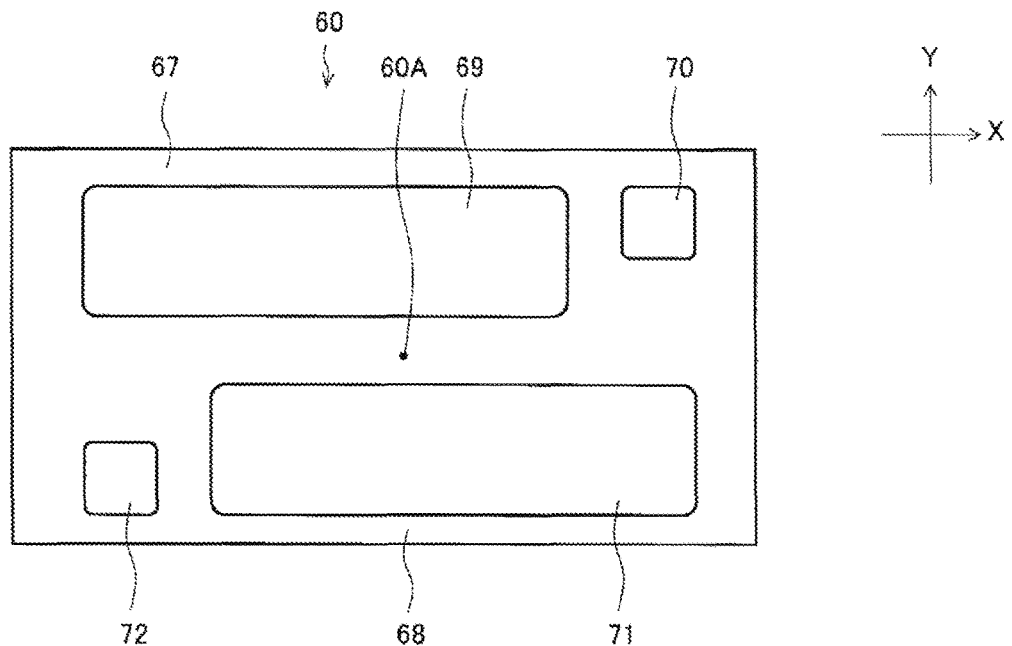
FIG. 4(B) illustrates a plan view illustrating the semiconductor chip embedded in the semiconductor device.
Figure 4C:
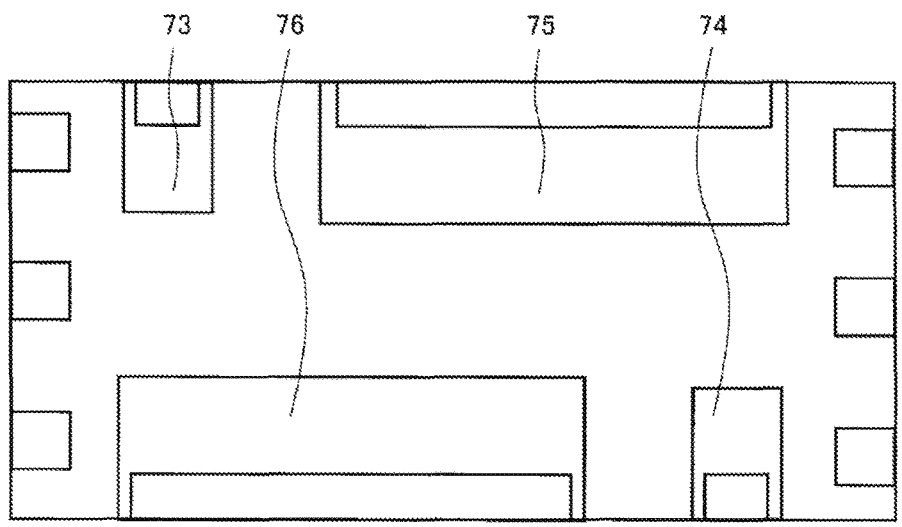
FIG. 4(C) illustrates a plan view illustrating the frame used in the semiconductor device in an embodiment of the present invention.

Next, as a modified example of the semiconductor device as described above, other exemplified aspects of the shape of the lead frame and the semiconductor chip are explained in detail based on FIG. 4(A) to FIG. 4(C).

FIG. 4(A) illustrates a plan view illustrating the inner configuration of the semiconductor device, FIG. 4(B) illustrates a plan view illustrating the semiconductor chip embedded in the semiconductor device as shown in FIG. 4(A).

As shown in FIG. 4(A), the semiconductor device 51 is a configuration that source terminals 53 and 55 and VM terminal 54 and VDD terminal 56 as power terminals exposed from the two side surfaces 52A and 52B of the package 52 indicated by the long dashed short dashed line are exposed. Next, a configuration that the gate terminals 57 and 58 are not exposed from the two side surfaces 52A and 52B of the package 52 while exposed from the back surface (not shown in the drawings) of the package 52 is formed.

Further, the exposed surface of a part of each terminals 53-56 that are exposed from the package 52 are substantially formed to be the same surface with the side surfaces 52A and 52B, and thereby function as the outer lead connected to the external pattern. Similarity, the exposed surface of a part of the gate terminals 57 and 58 that are exposed from the package 52 are substantially formed to be the same surface with the back surface of the package 52, and thereby function as the outer lead connected to the external pattern.

For example, the size of the package 52 along the width of x-axis direction on the page (the longitudinal direction of the package) is 5 mm, and the size of the package 52 along the width of y-axis direction on the page (the transverse direction of the package) is 2 mm. Also, in one aspect of the present embodiment, although the semiconductor device 1 is depicted as a six pin configuration, the configuration is not limited thereto, eight pins configuration or any appropriate design changes are possible.

Frame 59 is formed from the metal such as Cu and Fe—Ni alloy, the surface thereof is plated with the Ni—Pd—Au etc. The frame 59 is provided with the source terminals 53 and 55 mounted with the source electrodes 69 and 71 (referred to FIG. 4(B)) of the semiconductor chip 60 in a flip-chip manner, the gate terminals 57 and 58 mounted with the gate electrodes 70 and 72 (referred to FIG. 4(B)) of the semiconductor chip 60 in a flip-chip manner, and the VM terminal 54 and the VDD terminal 56 connected to the electrode pad (not shown in the drawings) of the IC chip 61 through the metal wires 62 and 63.

The source terminals 53 and 55 are divided along the x-axis direction on the page at the central area of the package 52, and each are extended to the x-axis direction on the page respectively. The source terminals 53 and 55 are mounted with the source electrodes 69 and 71 of the semiconductor chips 60 in a flip-chip manner, the most of the semiconductor chip 60 is fixed, and play a role as a die pad.

The gate terminals 57 and 58 are disposed in the vicinity of the corner portion in the upper left on the page and in the vicinity of the corner portion in the lower right on the page of the package 52. The gate terminals 57 and 58 are mounted with the gate electrodes 70 and 72 of the semiconductor chip 60 in a flip-chip manner.

For example, the gate terminals 57 and 58 are substantially an L-shape of the European character, one end of which is arranged in the vicinity of the two side surfaces 52A and 52B, and a part thereof extends in the X-axis direction on the page. The gate terminals 57 and 58 are provided with an area disposed toward the two side surfaces 52A and 52B than the semiconductor chip 60, and the metal wires 64 and 65 are electrically connected to the area.

Based on the configuration, in the y-axis direction on the page, it is possible to widen the width of the semiconductor chip 60 at maximum with respect to the width of the package 52, and the deterioration of the element characteristic of the semiconductor chip 60 due to the miniaturization of the chip size is prevented. In other words, it is possible to improve the performance of the element characteristic of the semiconductor chip 60 at maximum with respect to the size of the package 52.

Also, as shown in the drawings, the IC chip 61 and the semiconductor chip 60 electrically connected through the metal wire 62-66 are arranged substantially in an X shape of the European character. Next, the metal wires 62-66 are not cross with each other, such that the thinning of the package 52 can be realized.

As shown in FIG. 4(B), two MOSFET 67 and 68, for example, N channel type MOSFET 67 and 68 are formed at the semiconductor chip 60, each source electrode 69 and 71, and the gate electrode 70 and 72 are formed at the main surface thereof. For example, MOSFET 67 and 68 are differentially disposed in the left and right directions on the page, the gate electrode 70 of MOSFET 67 is disposed in the vicinity of upper end portion of the right side on the page of the semiconductor chip 60, and the gate electrode 72 of MOSFET 68 is disposed in the vicinity of lower end portion of the left side on the page of the semiconductor chip 60

As shown in the drawings, in a main surface of the semiconductor chip 60, the source electrodes 69 and 71 and the gate electrodes 70 and 72 are disposed rotationally symmetric with respect to a central point 60A of the semiconductor chip 60. Based on the configuration, when the semiconductor chip 60 is mounted at the frame 59, even in the case that in the state mounted by 180° rotation from the correct position, the semiconductor chip 60 is still provided with the two N channel type MOSFET 67 and 68 therein, malfunction would not occur and the yield according to the mount error is therefore improved.

Further, the source electrodes 69 and 71 are widely formed in the x-axis direction on the page, and the facing areas of the MOSFETs 67 and 68 are also widely formed. Based on the configuration, the current path in the semiconductor chip 60 becomes shorter, the junction area through which the current flows is also increased, and the on-resistance of the semiconductor chip is improved.

Moreover, the size of the protection circuit board for the secondary battery is limited in order to be disposed in the narrow space of the portable apparatus such as the smart phone etc., while the size of the MOSFET 67 and 68 with respect to the protection circuit board are enlarged as possible as it can, thereby it is possible to improve the performance of the characteristic for the module.

Otherwise, the effect based on the configuration of the corner portion of each electrodes 69-72 being a curved surface shape and the separation distance between each electrodes 69-72 are the same as the semiconductor chip 10 illustrated above using FIG. 1 and FIG. 2. Referring to the description, and its explanation will be omitted here.

Also, regarding to the shape of the frame, as shown in FIG. 4(C), it is also applicable for the case that the gate terminals 73 and 74 and the source terminals 75 and 76 are formed in a hanging pin shape.

Figure 5A:
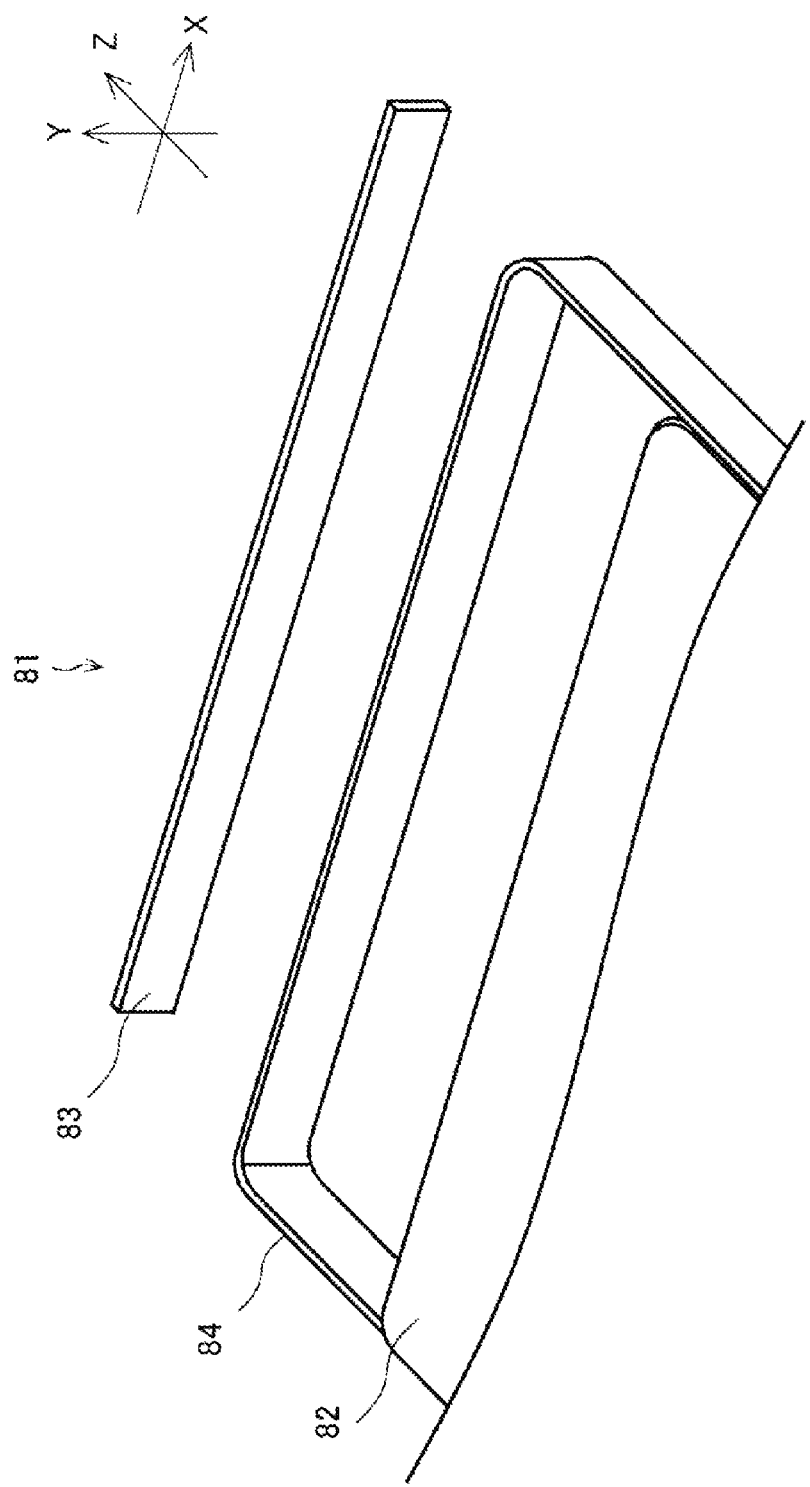
Figure 5B:
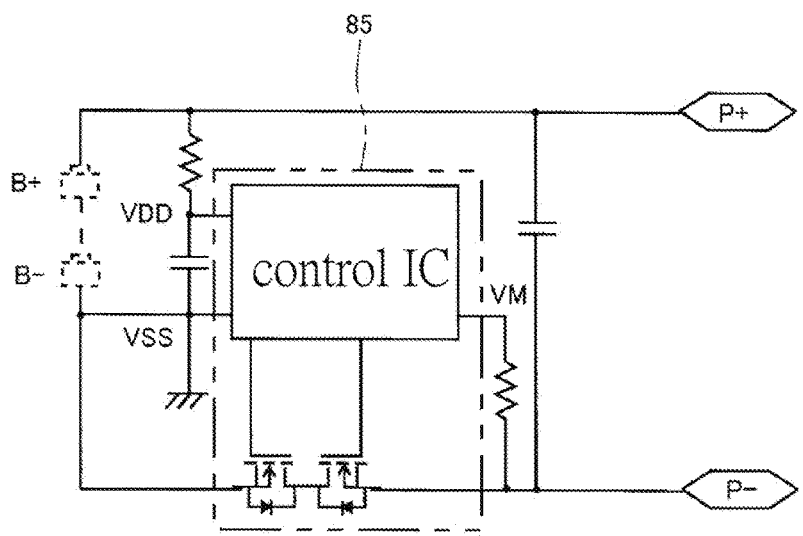
Figure 5C:
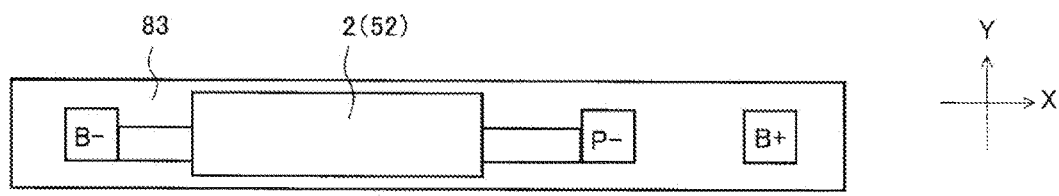
FIG. 5(C) is a plan view illustrating the protection circuit board of the secondary battery of a portable apparatus.
Figure 5D:
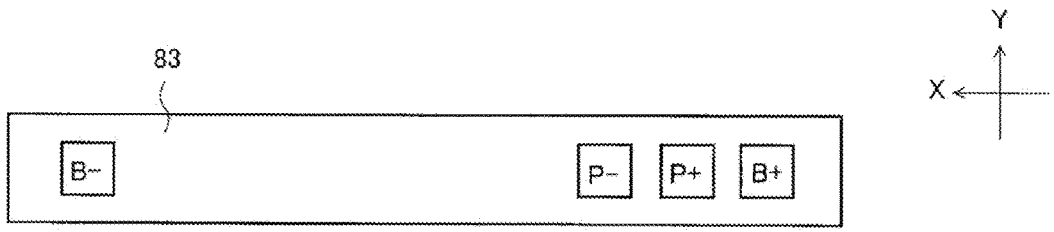
FIG. 5(D) is a plan view illustrating the protection circuit board of the secondary battery of a portable apparatus.
Figure 6:
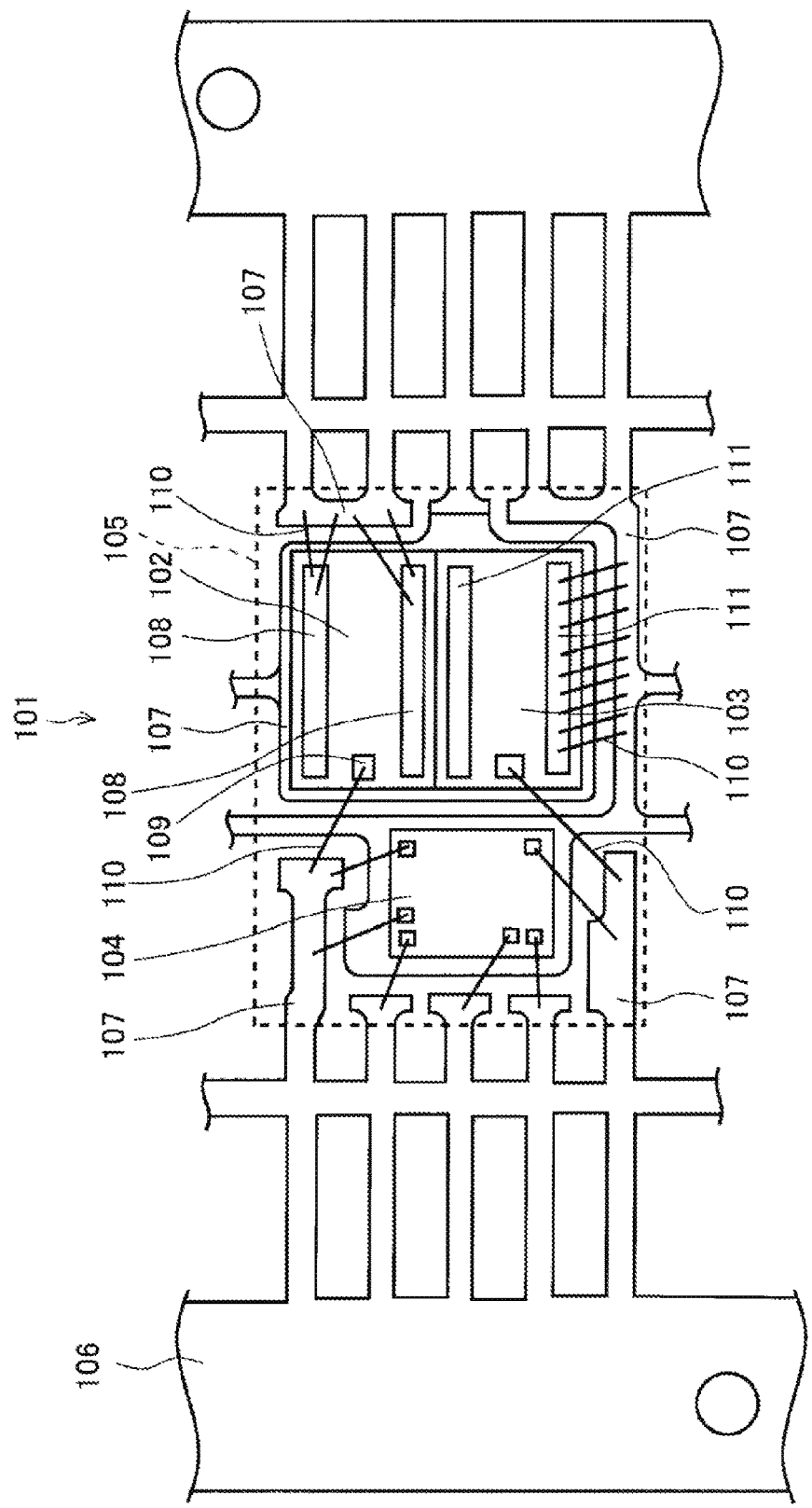
FIG. 6 illustrates a plan view illustrating the inner configuration of the conventional semiconductor device.
Figure 7:
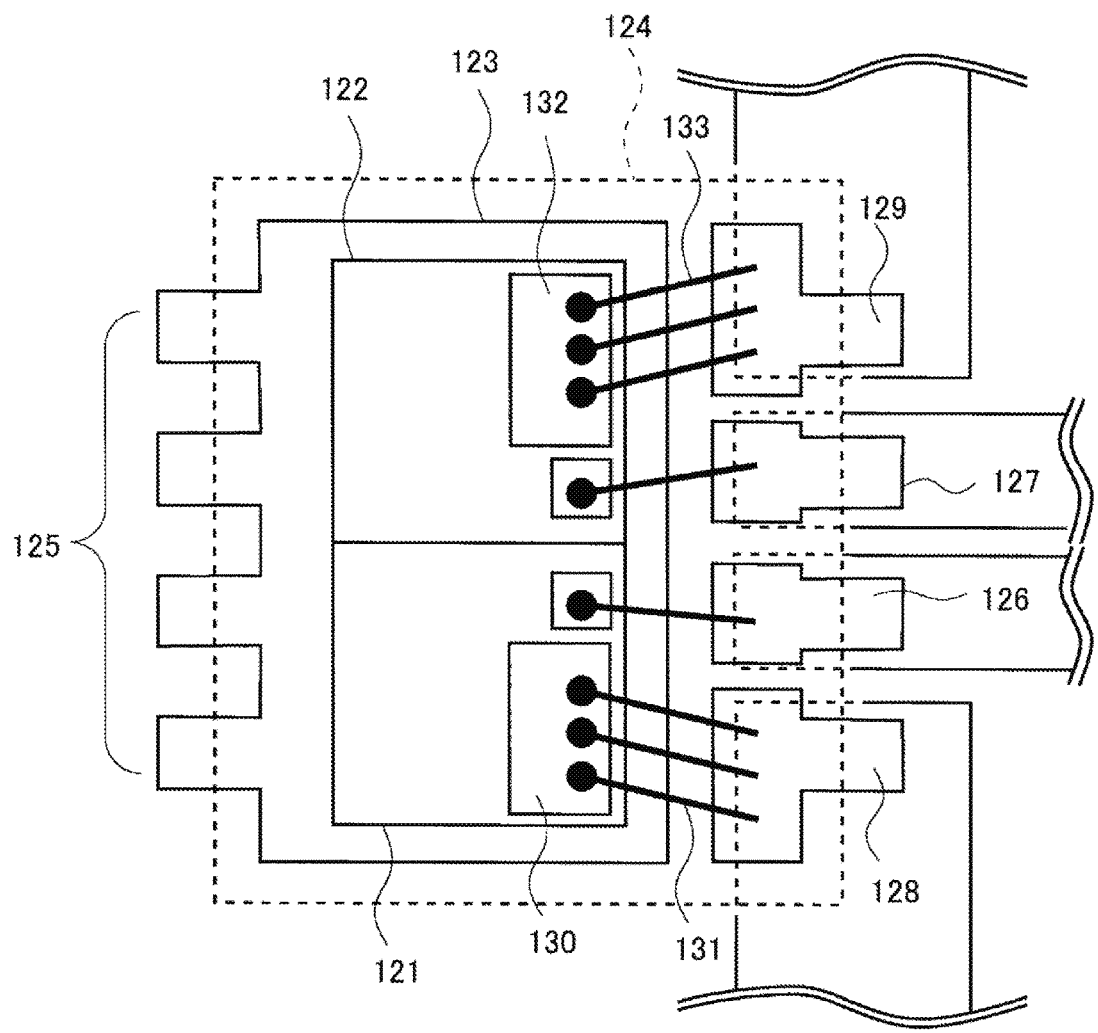
FIG. 7 illustrates a plan view illustrating the inner configuration of the conventional semiconductor device.
Figure 8:
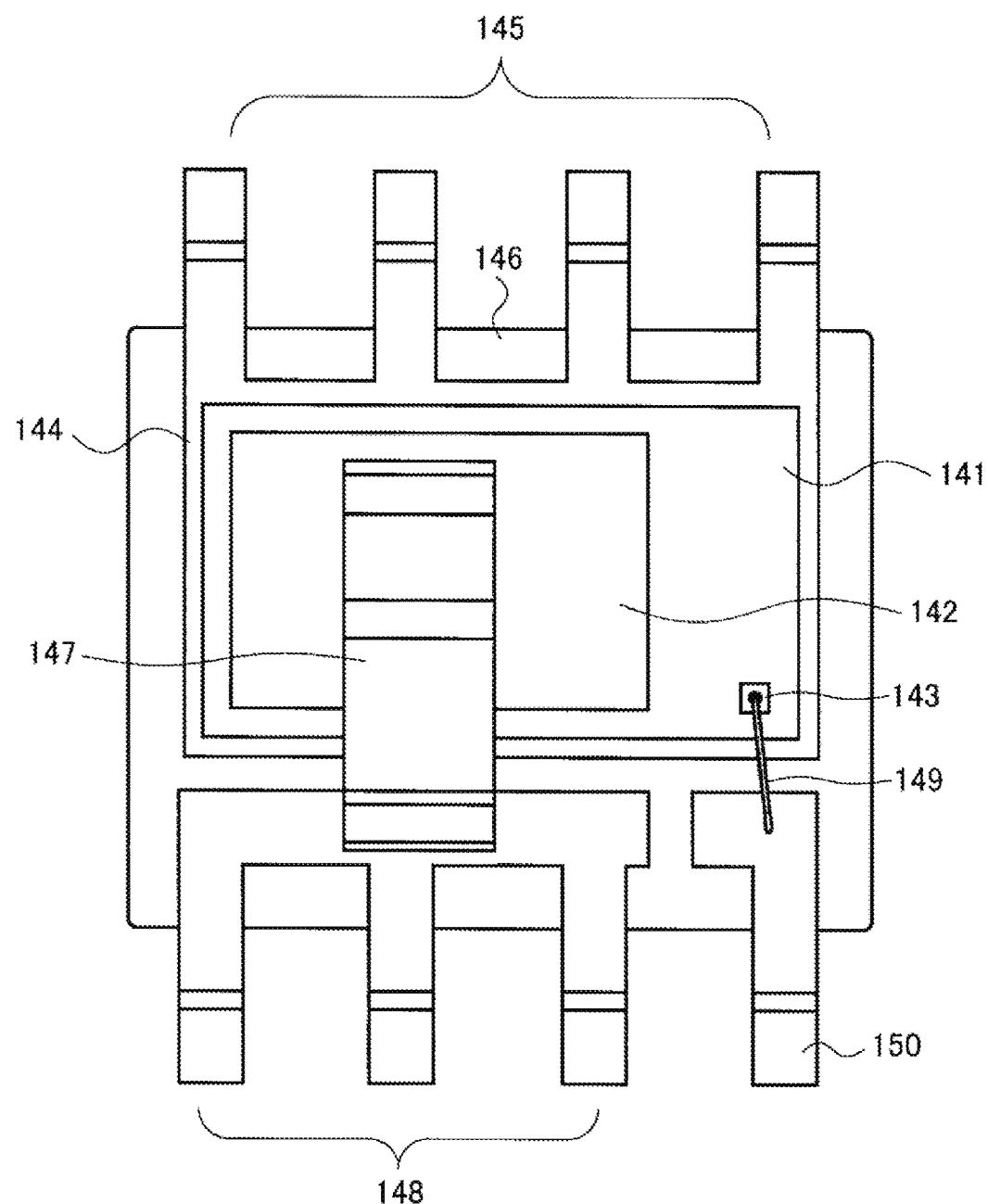
FIG. 8 illustrates a plan view illustrating the inner configuration of the conventional semiconductor device.

Next, FIG. 5(A) is the perspective view illustrating the secondary battery and the protection circuit board of the secondary battery accommodated in the housing of the portable apparatus. FIG. 5(B) is the protection circuit diagram formed in the protection circuit board, and FIG. 5(C) and FIG. 5(D) are the plan views for illustrating the outline of the protection circuit board shown in FIG. 5(A). Further, in FIG. 5(C) and FIG. 5(D), the protection circuit pattern is illustrated in a simplified manner.

As shown in FIG. 5(A), the portable apparatus 81 such as the mobile phone and the smartphone etc. is supplied with the power from a secondary battery 82 such as a lithium battery etc., and the secondary battery 82 is charged from the external power supply through the protection circuit board 83. The protection circuit board 83 is the board employing the battery management for charging and discharging the secondary battery 82.

Recently, along with the miniaturization and thinning of the portable apparatus 81, the miniaturization and thinning of the secondary battery 82 and the protection circuit board 83 has also proceed. As shown in the drawings, for example, the housing 84 of the portable apparatus 81 is in a shape of thin cuboid, in which the length in the Z-axis direction (longitudinal direction of the housing) on the page is about 150 mm, the length in the X-axis direction (transverse direction of the housing) on the page is about 80 mm, and the thickness in the Y-axis direction (thickness direction of the housing) on the page is about 7 mm. Next, in the case that the thickness of the housing 84 is about 7 mm, for the electronic component accommodated therein, the width in the Y-axis direction should be formed to be a width of about 4 mm.

As shown in FIG. 5(C) and FIG. 5(D), the protection circuit shown in FIG. 5(B) is formed using the front and rear surfaces of the protection circuit board 83. Next, P+ and P− are shown as the electrodes connected with +electrode and -electrodes that are provided at the housing 84 of the portable apparatus, and B+ and B− are shown as the electrodes connected with +electrode and −electrodes of the secondary battery 82. A circuit indicated by the two-dot chain line 85 are the circuit formed in the package 2 and 52 illustrated using FIG. 1 and FIGS. 4(A) to 4(C).

As shown in FIG. 5(C) and FIG. 5(D), in order to be provided in the housing 84 as arranged side by side with the XY plane on the page, the protection circuit board 83 is formed as a wide board in the x-axis direction on the page, in which the width thereof in the y-axis direction on the page is about 3 mm. Next, in FIG. 5(C), although a plan view seen from the side of the secondary battery 82 is shown, the packages 2 and 52 stated using FIG. 1-FIG. 4(C) is mounted on the wiring of the protection circuit. Further, in FIG. 5 (D), the plan surface of the back side of the protection circuit board 83 shown in FIG. 5(C) is illustrated.

As stated above using FIG. 1 and FIG. 4(C), the packages 2 and 52 are formed in a shape, in which it is shorter in the y-axis direction on the page and is longer in the x-axis direction on the page. As shown in FIG. 5(C), the width of the packages 2 and 52 are mounted with respect to the protection circuit board 83 limited in the thickness direction of the housing 84 (the y-axis direction on the page). Next, as stated above using FIG. 2(A) and FIG. 4(B), the width of the y-axis direction on the page of the semiconductor chips 10 and 60 are disposed as wide as possible with respect to the width of the y-axis direction on the page of the packages 2 and 52.

That is, although the packages 2 and 52 are especially limited in the width of the y-axis direction on the page, by the means of the layout of lead frames 9 and 59 and the layout of the electrodes of MOSFET 23, 24, 67 and 68, it is able to maximize the size of the semiconductor chips 10 and 60 and improve the performance for module.

Furthermore, as described above referring to FIG. 1, the lead 3 and 4 of MOSFET 23 and the lead 5 of the VDD terminal 16 are derived from the side of the side surfaces 2A of the package 2, the lead 6 and 7 of MOSFET 24 and the lead 8 of the VM terminal 17 are derived from the side of the side surfaces 2B of the package 2. Based on the package configuration, in the protection circuit board 83, although the whole wiring is not shown, the wiring connected to the leads 3-8 is disposed in the x-axis direction on the page, and there is no necessary to provide the wiring connected to the leads 3-8 in the upper and lower sides of the packages 2 of the y-axis direction on the page. Next, package 2 is efficiently mounted to be shorter in the y-axis direction on the page and longer in the x-axis direction on the page with respect to the protection circuit board. Furthermore, the package 52 describe above referring to FIG. 4(A) is the same.

Further, in an aspect of the present embodiments, although a case that the leads 3-8 are derived from the two side surfaces 2A and 2B of the package toward the outside is illustrated, the present invention is not limited to this case. For example, a case of a non-lead type package that the leads 3-8 are formed in the same plane with the two side surfaces of the package 2 without the leads derived to the outside is also applicable.

Moreover, although a case that the source terminals 11 and 12, the gate terminals 13 and 14, the VDD terminal 16 and the VM terminals 17 of the frame 9 are exposed from the back side of the package 2 is illustrated, the present invention is not limited to this case. For example, up to the side of the back side of the above terminals are covered by the encapsulation resin, and for example, a case that the wiring of the protection circuit board is mounted with the leads 3-8 derived from the side surfaces 2A and 2B of the package 2 are processed into a gull wing shape is also applicable. In addition, various modifications are possible provided it does not depart from the gist of the present invention.

What is claimed is:

1. A semiconductor device, comprising:
   a frame;
   a semiconductor chip having a main surface mounted on the frame in a flip-chip manner;
   an integrated circuit (IC) chip stacked and fixed on a surface of the semiconductor chip opposite to the main surface;
   metal wires electrically connected to the semiconductor chip and the IC chip; and
   a package encapsulating the frame, the semiconductor chip, the IC chip, and the metal wires,
   wherein the package has two side surfaces opposite to each other in the longitudinal direction of the package,
   wherein the semiconductor chip is formed with a first transistor and a second transistor, a gate electrode and a source electrode of the first transistor formed on the main surface is arranged beside one of the side surfaces of the package, and a gate electrode and a source electrode of the second transistor formed on the main surface is arranged beside the other one of the side surfaces of the package, and
   wherein gate terminals of the frame mounted with the gate electrodes are respectively extended to the two side surfaces of the package, and at least one of the source electrodes on the main surface is electrically connected to the IC chip on the semiconductor chip through at least one of the metal wires.

2. The semiconductor device according to claim 1, wherein one of the gate terminals of the frame where the gate electrode of the first transistor is mounted extends along the longitudinal direction and is exposed from the one of the side surfaces of the package, and the other one of the gate terminals of the frame where the gate electrode of the second transistor is mounted extends along the longitudinal direction and is exposed from the other one of the side surfaces of the package.

3. The semiconductor device according to claim 2, wherein the metal wire electrically connected to the gate electrode of the first transistor is connected to the gate terminal of the frame between the gate electrode of the first transistor and the one of the side surfaces of the package, and the metal wire electrically connected with the gate electrode of the second transistor is connected to the gate terminal of the frame between the gate electrode of the second transistor and the other one of the side surfaces of the package.

4. The semiconductor device according to claim 3, wherein the semiconductor chip has a common drain electrode of the first transistor and the second transistor formed on the surface opposite to the main surface, wherein a source terminal of the frame where the source electrode of the first transistor is mounted is exposed from the one of the side surfaces of the package, and wherein a source terminal of the frame where the source electrode of the second transistor is mounted is exposed from the other one of the side surfaces of the package.

5. The semiconductor device according to claim 2, wherein the semiconductor chip has a common drain electrode of the first transistor and the second transistor formed on the surface opposite to the main surface, wherein a source terminal of the frame where the source electrode of the first transistor is mounted is exposed from the one of the side surfaces of the package, and wherein a source terminal of the frame where the source electrode of the second transistor is mounted is exposed from the other one of the side surfaces of the package.

6. The semiconductor device according to claim 1, wherein the metal wire electrically connected to the gate electrode of the first transistor is connected to one of the gate terminals of the frame between the gate electrode of the first transistor and the one of the side surfaces of the package, and the metal wire electrically connected with the gate electrode of the second transistor is connected to the other one of the gate terminals of the frame between the gate electrode of the second transistor and the other one of the side surfaces of the package.

7. The semiconductor device according to claim 6, wherein the semiconductor chip has a common drain electrode of the first transistor and the second transistor formed on the surface opposite to the main surface, wherein a source terminal of the frame where the source electrode of the first transistor is mounted is exposed from the one of the side surfaces of the package, and wherein a source terminal of the frame where the source electrode of the second transistor is mounted is exposed from the other one of the side surfaces of the package.

8. The semiconductor device according to claim 1, wherein the semiconductor chip has a common drain electrode of the first transistor and the second transistor formed on the surface opposite to the main surface, wherein a source terminal of the frame where the source electrode of the first transistor is mounted is exposed from the one of the side surfaces of the package, and wherein a source terminal of the frame where the source electrode of the second transistor is mounted is exposed from the other one of the side surfaces of the package.

9. The semiconductor device according to claim 1, wherein a source electrode of the first transistor is arranged side by side with the gate electrode of the first transistor in the longitudinal direction of the semiconductor chip; a source electrode of the second transistor is arranged side by side with the gate electrode of the second transistor in the longitudinal direction of the semiconductor chip, wherein the gate electrode and the source electrode of the first transistor and the gate electrode and the source electrode of the second transistor are disposed rotationally symmetric with respect to a central point of the semiconductor chip.

10. A portable apparatus, comprising:
a protection circuit board for a secondary battery; and
the semiconductor device according to claim 1,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

11. A portable apparatus, comprising:
a protection circuit board for a secondary battery; and
the semiconductor device according to claim 2,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

12. A portable apparatus, comprising:
a protection circuit board for a secondary battery; and
the semiconductor device according to claim 3,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

13. A portable apparatus, comprising:
a protection circuit board for a secondary battery; and
the semiconductor device according to claim 4,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

14. A portable apparatus, comprising:
a protection circuit board for a secondary battery; and
the semiconductor device according to claim 5,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

15. A portable apparatus, comprising:
a protection circuit board for a secondary battery; and
the semiconductor device according to claim 6,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

16. A portable apparatus, comprising:
a protection circuit board for a secondary battery; and
the semiconductor device according to claim 7,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

17. A portable apparatus, comprising:
a protection circuit board for a secondary battery; and
the semiconductor device according to claim 8,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

18. A portable apparatus, comprising:
a protection circuit board for a secondary battery; and
the semiconductor device according to claim 9,
wherein the package of the semiconductor device is mounted on the protection circuit board, wherein the longitudinal direction of the package is disposed along the longitudinal direction of the protection circuit board, and the transverse direction of the protection circuit board is disposed along the thickness direction of a housing of the portable apparatus.

* * * * *